United States Patent
Walther et al.

(10) Patent No.: US 7,459,703 B2
(45) Date of Patent: Dec. 2, 2008

(54) ION IMPLANT BEAM ANGLE INTEGRITY MONITORING AND ADJUSTING

(75) Inventors: Steven Walther, Andover, MA (US); Ukyo Jeong, Andover, MA (US); Sandeep Mehta, Boxford, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 142 days.

(21) Appl. No.: 11/217,700

(22) Filed: Aug. 31, 2005

(65) Prior Publication Data
US 2007/0045569 A1 Mar. 1, 2007

(51) Int. Cl.
*G21K 5/10* (2006.01)
(52) U.S. Cl. .............................. 250/492.21; 250/492.1
(58) Field of Classification Search ............ 250/492.21, 250/493.1–504 H, 492.1–492.3
See application file for complete search history.

(56) References Cited

U.S. PATENT DOCUMENTS 6,852,984 B2 * 2/2005 Krueger ....................... 250/397

* cited by examiner

*Primary Examiner*—Jack I Berman
*Assistant Examiner*—Andrew Smyth

(57) ABSTRACT

A system, method and program product for monitoring the beam angle integrity of an ion beam generated by an ion implanter system are disclosed. The invention utilizes at least one template with each template having a template surface that impedes the motion of an ion. Each template is configured such that an ion impacts the surface of the template if the trajectory of the template deviates from the optimum trajectory by a pre-determined maximum variance angle. The change caused by the impact of the ions with the template and/or a target is then measured to determine the amount of variance in the ion beam. Adjustments can then be made to the ion beam generator to correct for a misaligned beam.

24 Claims, 10 Drawing Sheets

US 7,459,703 B2

ION IMPLANT BEAM ANGLE INTEGRITY MONITORING AND ADJUSTING

BACKGROUND OF THE INVENTION

1. Technical Field

The present invention relates generally to ion implantation, and more particularly, to a system, method and program product for monitoring and adjusting beam angle integrity of an ion beam.

2. Related Art

One of the most important steps in the fabrication of semiconductors is doping the materials used to make the semiconductor. Doping is a process in which atoms of an element are introduced into a semiconductor for the purpose of altering its electrical properties. This may be accomplished by in situ doping, in which the atoms are introduced during the growth of the crystal, or, more often, may be introduced after crystal formation in a process known as ion implantation. In this process, ions of the desired dopant are implanted into the surface of the target substance such as silicon.

One of the systems that is most widely used for ion implantation type doping is an ion accelerator type ion implanter system. A typical ion accelerator type ion implanter system has an ion generator that generates ion particles. The system then uses magnets to accelerate the ion particles, focus the ion particles into an ion beam and direct the ions in the ion beam to the target into which they are to be implanted.

One problem in the industry lies in monitoring the integrity of the ion beam generated by the ion accelerator type ion implanter. A discussion of the ion beam angle integrity problem is located in U. Jeong, S. Mehta, C. Campbell, R. Lindberg, Z. Zhao, B. Cusson and J. Buller, "Effects of Beam Incident Angle Control on MNOS Source/Drain Extension Application," $14^{th}$ International Conference on Ion Implantation Technology, Taos, NM, USA, Sep. 22-27, 2002, which is hereby incorporated by reference. In an optimal ion beam, all ions travel along an ideal path or trajectory. Because ions of the same charge are repelled from one another, some variance of ions from the ideal path of the ion beam is normal. However, variance beyond a certain angle from the optimum trajectory can be problematic. This variance may be caused by collisions among ions in the beam or by the above mentioned natural repulsion of the ions from one another leading to portions of the beam becoming divergent (beam non-parallelism). Additionally, the ion implanter system may, over time, become misaligned, causing the entire beam to deviate from the normal angle (beam steering). FIGS. 1A and 1B are cross-sectional views of ions that deviate from a normal angle striking targets. Both of the targets in FIGS. 1A and 1B have alternating substrate layers, labeled silicon nitride ("nitride") and silicon dioxide ("oxide"). The target in FIG. 1A is said to be an angle insensitive structure because even though beam steering has occurred, the relative width of the trench ensures that a large percentage of the ions reach the bottom of the trench. Conversely, the beam steering combined with the relative height of the trench in FIG. 1B causes a relatively small percentage of ions to reach the bottom of the trench. The target in FIG. 1B is referred to as an angle sensitive structure because it is particularly sensitive to any deviation in the angle of the ion beam. Additionally, a small undercut P1 created by isotropic overetch causes further sensitivity of the FIG. 1B target to ion beam angle deviation.

Ions that strike a target from a trajectory outside of the maximum variance angle may cause unwanted changes, known as shadowing, in the material that the ions strike that is adjacent to the desired implant area. This shadowing may cause the material in the device to function other than optimally. For example, a large number of ions striking outside the trajectory of the maximum variance angle may cause the device to function incorrectly or not at all. Accordingly, it is important to be able to monitor the beam angle integrity of the ion implant beam.

In view of the foregoing, there is a need in the art for monitoring the integrity of the beam angle of an ion implant beam.

SUMMARY OF THE INVENTION

A system, method and program product for monitoring the beam angle integrity of an ion beam generated by an ion implanter system are disclosed. The invention utilizes at least one template with each template having a template surface that impedes the motion of an ion. Each template is configured such that an ion impacts the surface of the template if the trajectory of the template deviates from the optimum trajectory by a pre-determined maximum variance angle. The change caused by the impact of the ions with the template and/or a target is then measured to determine the amount of variance in the ion beam. Adjustments can then be made to the ion beam generator to correct for a misaligned beam.

A first aspect of the invention is directed to an ion implanter system, the system comprising: an ion beam generator for generating an ion beam; at least one template for positioning adjacent an ion beam path, each template having a template surface that impedes a motion of an ion in the ion beam in response to the ion impacting the template surface, wherein the ion impacts the template surface in the case that a trajectory of the ion varies from an optimum trajectory by at least a pre-determined maximum variance angle; and means for determining, using at least one of the at least one template and a target, whether an ion beam trajectory varies from the optimum trajectory by at least the pre-determined maximum variance angle to monitor an integrity of the ion beam.

A second aspect of the invention is directed to a system for monitoring an integrity of an ion beam, the system comprising: at least one template positioned adjacent an ion beam path, each template having a template surface that impedes a motion of an ion wherein the ion impacts the template wall in the case that a trajectory of the ion varies from an optimum trajectory by at least a pre-determined maximum variance angle; and means for determining, using at least one of the at least one template and a target, whether an ion beam trajectory varies from the optimum trajectory by at least the pre-determined maximum variance angle to monitor the integrity of the ion beam.

A third aspect of the invention is directed to a method of monitoring angle integrity of an ion beam, the method comprising the steps of: transmitting an ion beam adjacent to at least one template, the at least one template having a template surface that impedes a motion of an ion that varies from an optimum trajectory by at least a predetermined maximum variance angle; and determining, using at least one of the at least one template and a target, whether an ion beam trajectory varies from the optimum trajectory by at least the pre-determined maximum variance angle to monitor angle integrity of the ion beam.

A fourth aspect of the invention is directed to a computer program product comprising a computer useable medium having computer readable program code embodied therein for determining the integrity of the angle of an ion beam generated by a ion implanter system and transmitted by the ion implanter system, the program product comprising: program code configured to control transmitting an ion beam adjacent to at least one template, the at least one template having a surface that impedes a motion of an ion that varies from an optimum trajectory by at least a predetermined maximum variance angle; and program code configured to determine, using at least one of the at least one template and a target, whether an ion beam trajectory varies from the optimum trajectory by at least the pre-determined maximum variance angle to monitor angle integrity of the ion beam.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Ion Acceleration Type Ion Implanter System Overview

Figure 1A:
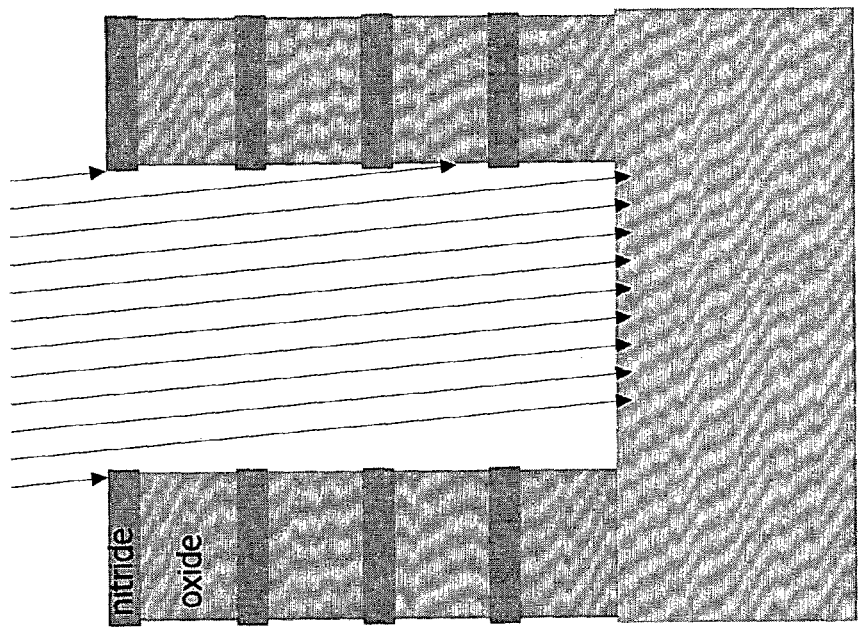
FIG. 1A shows a cross-sectional view of ions that deviate from a normal angle striking an angle insensitive structure, according to the prior art.
Figure 1B:
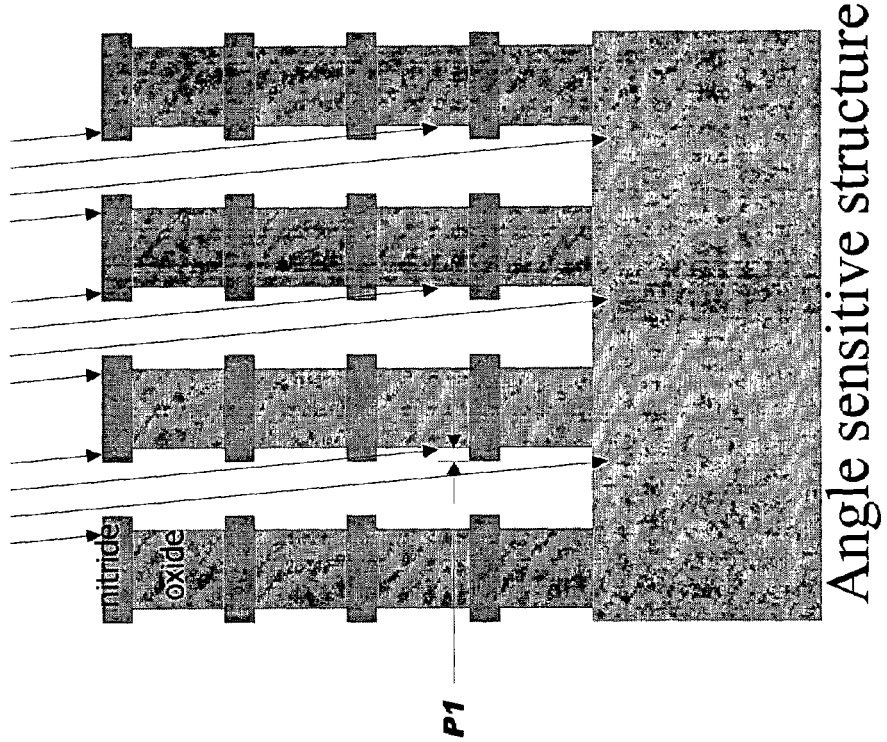
FIG. 1B shows a cross-sectional view of ions that deviate from a normal angle striking an angle sensitive structure, according to the prior art.
Figure 2:
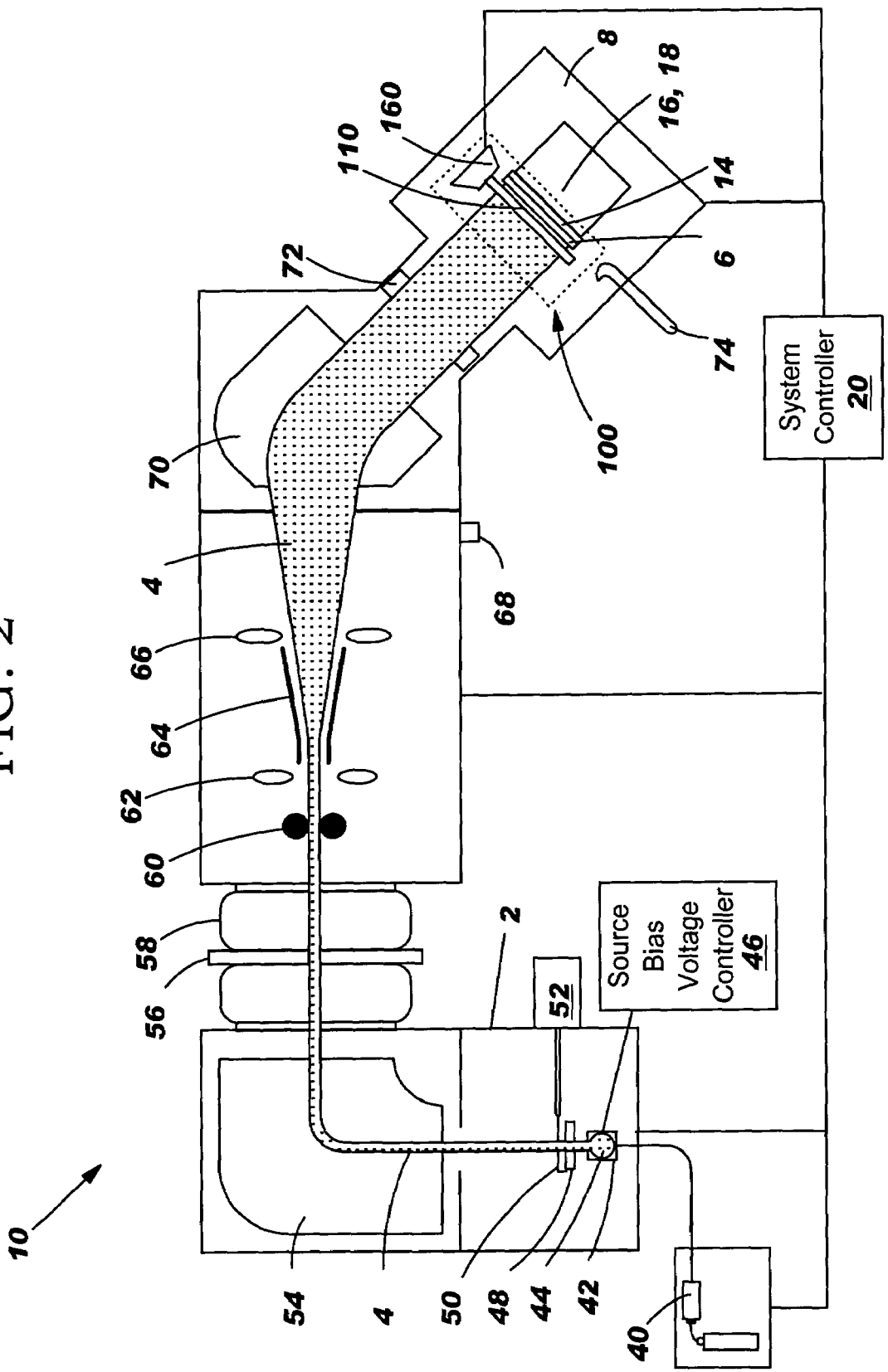
FIG. 2 shows an ion acceleration type ion implanter system with ion impact beam angle integrity monitoring system according to one embodiment of the invention.

With reference to the accompanying drawings, FIG. 2 illustrates an ion acceleration type ion implanter system 10, which may be used in the present invention. Implanter system 10 includes an ion beam generator 2 for generating and transmitting an ion beam 4 to a target 6 in an implant chamber 8. Ion beam generator 2 may be any now known or later developed ion beam generator such as those available from Varian Semiconductor Equipment Associates. Typically, target 6 includes one or more semiconductor wafers mounted to a platen 14. Characteristics of platen 14 and, hence, target 6, may be controlled by a platen drive assembly 16 that rotates the target 6, i.e., wafer, and a target vertical scan system position controller 18 that controls the vertical position of target 6. Drive assembly 16 and position controller 18 are both responsive to a system controller 20.

Besides the above-described components, ion beam generator 2 may include a gas flow 40; an ion source 42 including a source magnet 44 and a source bias voltage controller 46; a suppression electrode 48, an extraction electrode 50 and one or more manipulator motors 52 for electrodes 48, 50; an analyzer magnet 54; an accelerator focus electrode 56; an accelerator suppression electrode 58; a mass slit 60; a pre-scan suppression electrode 62; horizontal scan plates 64; a post-scan suppression electrode 66; a nitrogen ($N_2$) bleed 68; a corrector magnet 70; a limiting aperture 72; and a profiler system 74. Although not shown for clarity sake, each of the above-described components is monitored by and responsive to system controller 20.

Ion acceleration type ion implanter system 10 may also include an ion implant beam angle integrity monitor system 100. Integrity monitor system 100 may have a template 110 and a determinator 160, both of which will be described in further detail below. Additional features of integrity monitor system 100 will also be described in detail below. Although a sample ion acceleration type ion implanter system 10 has been illustrated, it should be understood by those skilled in the art that any now known or later developed system to generate ion beam 4 may be used.

Ion Beam Integrity Monitor

Figure 3A:
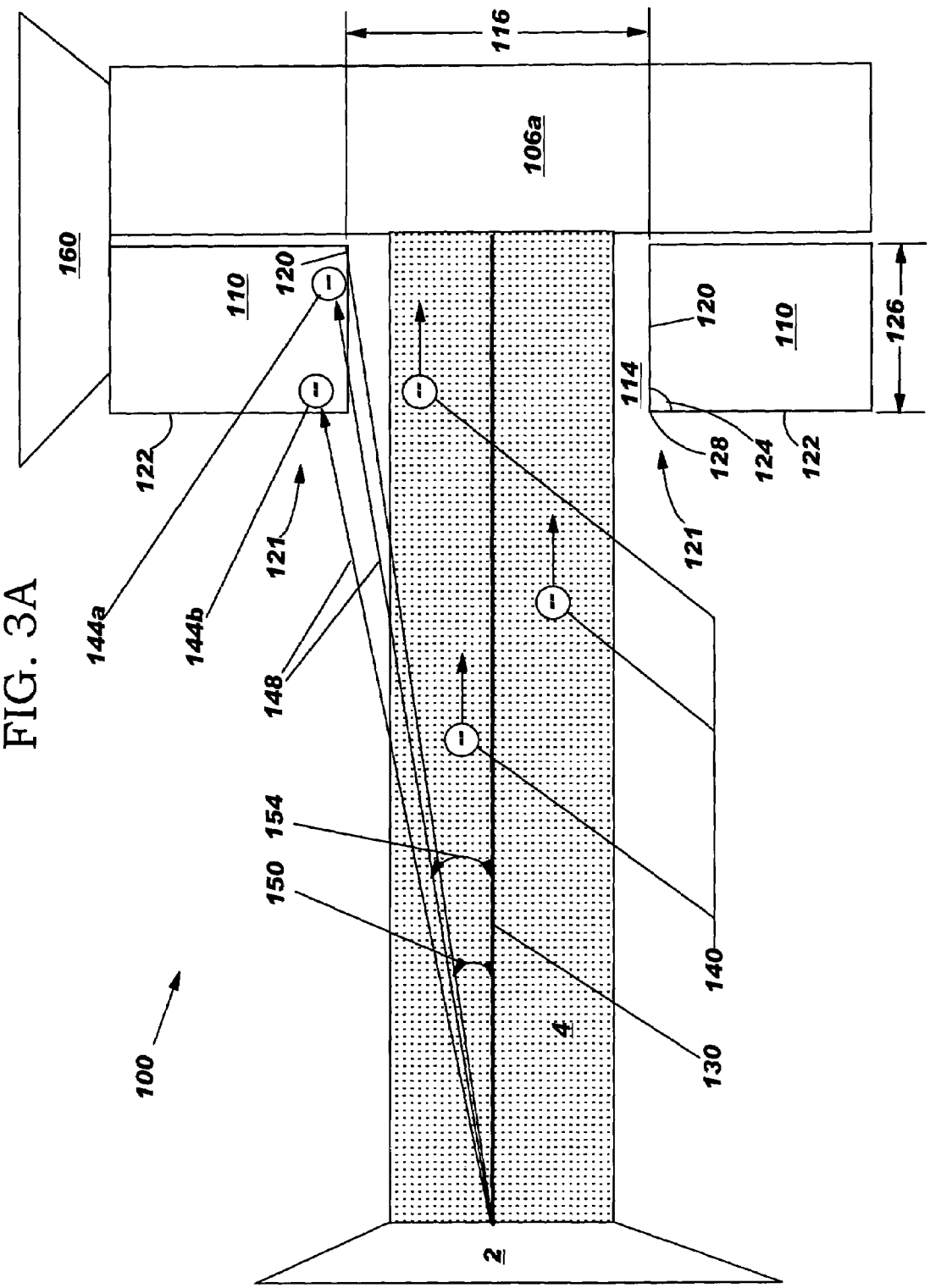
FIG. 3A shows a cross-sectional view of an ion impact beam angle integrity monitoring system according to one embodiment of the invention.
Figure 3B:
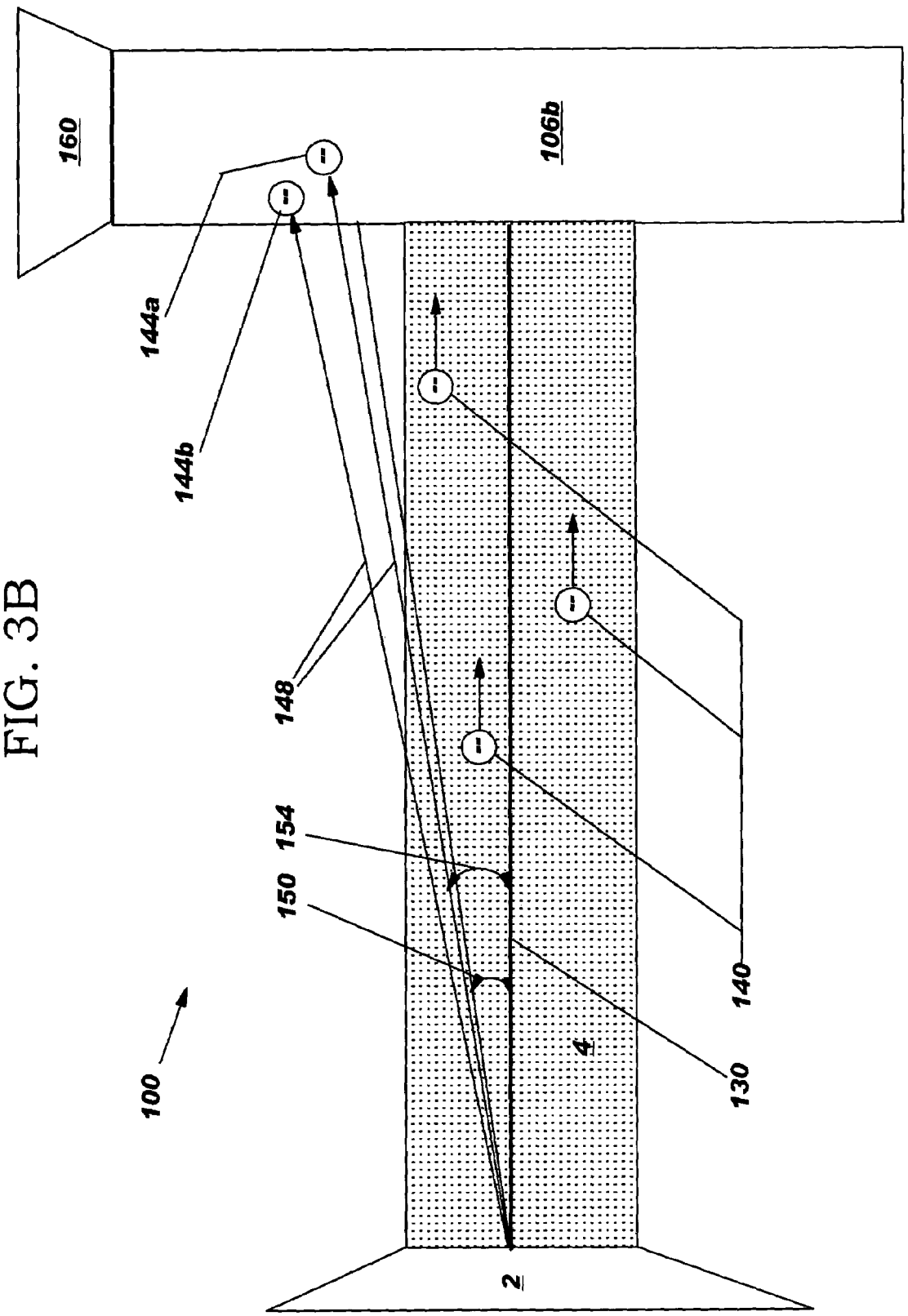
FIG. 3B shows a cross-sectional view of an ion beam being directed directly on a target according to another embodiment of the invention.
Figure 3C:
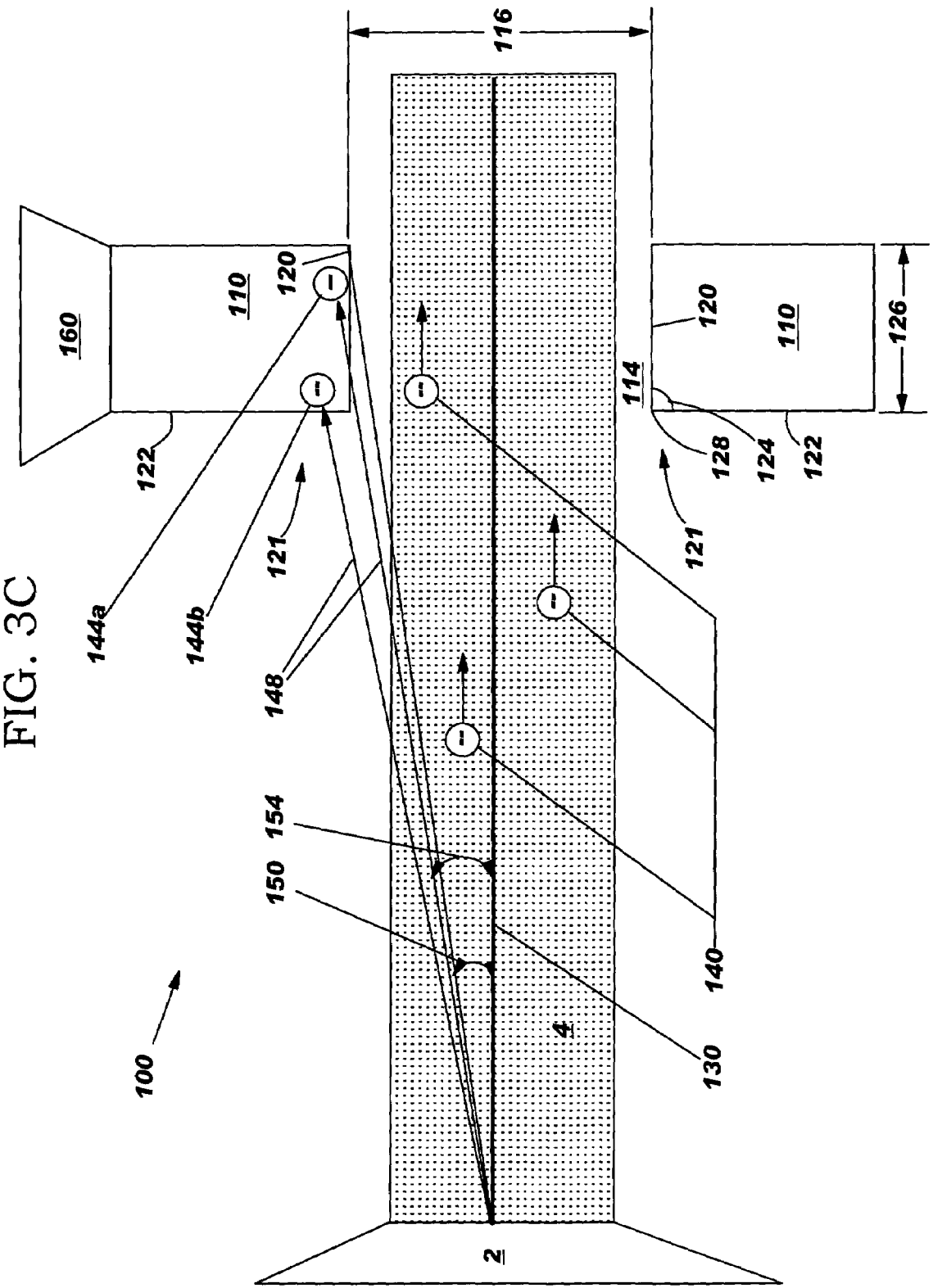
FIG. 3C shows a cross-sectional view of an ion beam being directed along a wall of a template in the absence of a target according to another embodiment of the invention.

FIGS. 3A-3C show an expanded cross-sectional view of integrity monitor system 100 of FIG. 2, with an ion beam generator 2 transmitting ion beam 4. As indicated above, ion beam generator 2 may be part of ion implanter system 10 (FIG. 2) or any system that may be used to generate ion beam 4. FIGS. 3A and 3C show transmission of ion beam 4 along a wall 120 of template 110 while FIG. 3B shows transmission of ion beam directly to target 106b. Wall 120 (FIGS. 3A, 3C) may be roughly perpendicular to an outer surface 122 of template 120 or may form a non-perpendicular angle 124 with respect to outer surface 122. Integrity monitor system 100 may also include target 106a, 106b (FIG. 3A, 3B), toward which ion beam 4 may be transmitted either along wall 120 (FIG. 3A) or directly (FIG. 3B). Additionally, template 110 (FIGS. 3A, 3C) may include an opening 114 through which ion beam 4 is transmitted along wall 120. Opening 114 may have an opening width 116 and wall 120 may have a wall depth 126 (FIGS. 3A, 3C). Template 110 (FIGS. 3A, 3C) may be designed such that an aspect ratio of opening width 116 to wall depth 126 is defined as explained further below. At least a portion of a surface 121 of template 110 (FIGS. 3A, 3C), which may include at least a portion of wall 120, outer surface 122, or both, may be made of a material that impedes the motion of an ion 144a, 144b in response to ion 144a, 144b impacting surface 121 of template 110. The impeding of the motion of ion 144a, 144b prevents ion 144a, 144b from impacting target 106 and may include completely halting its motion, slowing its motion, changing its motion, a combination of the above, or any other way of impeding motion now known or later developed. Additionally, at least a portion of surface 121 of template 110 (FIGS. 3A, 3C) may be made of a material that may change in some way in response to impacting by ion 140, 144a, 144b. This material may include a photoresist, an oxide, a nitride hard mask or any other material now known or later developed that undergoes a change in response to impacting by ion 140, 144a, 144b.

As stated above, at least one template 110 may be positioned between ion beam generator 2 and target 106 (FIG. 3A) or, in an alternative embodiment described more fully below, may be positioned in the absence of a target (FIG. 3C). Ion beam generator 2 directs an ion beam 4 containing at least one ion 140, 144a, 144b along wall 120 of template 110 (FIGS. 3A, 3C). Ideally, ion beam 4 is directed along an optimum trajectory 130. An ion 144a, 144b that has a trajectory 148 that has a variance angle 154 that varies from optimum trajectory 130 by more than a maximum variance angle 150 will impact surface 121, such as wall 120 and/or outer surface 122 of template 110. In one embodiment, maximum variance angle 150 may correspond to the aspect ratio of opening width 116 to wall depth 126.

Referring now to FIGS. 3A and 3B, in one embodiment, ion beam generator 2 directs ion beam 4 containing at least one ion 140, 144*a*, 144*b* along wall 120 of template 110 toward a first test target 106*a* (FIG. 3A). First test target 106*a* and template 110 (FIG. 3A) are then replaced with a second test target 106*b* (FIG. 3B) without a template and the same ion beam generator 2 directs ion beam 4 containing at least one ion 140, 144*a*, 144*b* directly toward second test target 106*b* (FIG. 3B). It should be understood that ion beam 4 initially could be directed toward second test target 106*b* (FIG. 3B), second test target 106*b* could be replaced with first test target 106*a* and template 110 (FIG. 3A), and subsequently ion beam 4 could be directed along wall 120 of template toward first test target 106*a* (FIG. 3A). In any case, ion 144*a*, 144*b* that has a trajectory 148 that has a variance angle 154 that varies from optimum trajectory 130 by more than maximum variance angle 150 will impact second test target 106*b* (FIG. 3B), but will not impact first test target 106*a* (FIG. 3A) because ion 144*a*, 144*b* will strike surface 121 of template 110, which will impede the motion of ion 144*a*, 144*b*. Ion beam angle integrity may then be determined by using determinator 160 to measure a difference between a first number of ions 140, 144*a*, 144*b*, that impact first test target 106*a* and a second number of ions 140 that impact second test target 106*b* and thereby determine whether the trajectory of ion beam 4 varies from optimum trajectory 130 by more than maximum variance angle 150. Determinator 160 may also be used in this way to determine what percentage of ion beam 4 is within maximum variance angle 150.

Determinator 160 may measure changes in test targets 106*a*, 106*b* during transmission of ion beam 4 or determinator 160 may be separate from targets 106*a*, 106*b* during transmission of ion beam 4 and only used after transmission of ion beam 4 has occurred. In terms of the latter situation, determinator 160 may determine the dose in test targets 106*a*, 106*b* by a number of techniques (sheet resistance, SIMS, Thermawave, etc.). For example, each of first test target 106*a* and second test target 106*b* can be annealed to electrically activate the ions 140, 144*a*, 144*b* and be probed for sheet resistance to measure the concentration of ions 140, 144*a*, 144*b*. In terms of in-situ determination, determinator 160 may also include instruments to measure photoresist response, instruments to measure electrical resistance, instruments to measure changes in mass or any other means of measuring change of materials now known or later developed. This determination may then be used to adjust ion beam 4 generated by ion beam generator 2, such as by narrowing angle of ion beam 4.

Referring now to FIGS. 3A and 3C, in an alternative embodiment, ion beam generator 2 directs ion beam 4 containing at least one ion 140, 144*a*, 144*b* along wall 120 of template 110. Ion beam 4 may be directed along wall 120 of template 110 toward target 106*a* (FIG. 3A) or no target (FIG. 3C) as desired by the user. In this embodiment, the impact of ion 144*a*, 144*b* with a portion of surface 121 of template 110, such as wall 120 or outer surface 122, causes a change in template 110. This change in template 110 may be measured using determinator 160 to determine whether and/or in what percentage the trajectory of ion beam 4 varies from optimum trajectory 130 by at least predetermined maximum variance angle 150. As described above, determinator 160 may measure changes in template 120 during transmission of ion beam 4 or determinator 160 may be separate from template 120 during transmission of ion beam 4 and only used after transmission of ion beam 4 has occurred. Again, determinator 160 may include instruments to measure photoresist response, instruments to measure electrical resistance, instruments to measure changes in mass or any other means of measuring change of materials now known or later developed.

Figure 4:
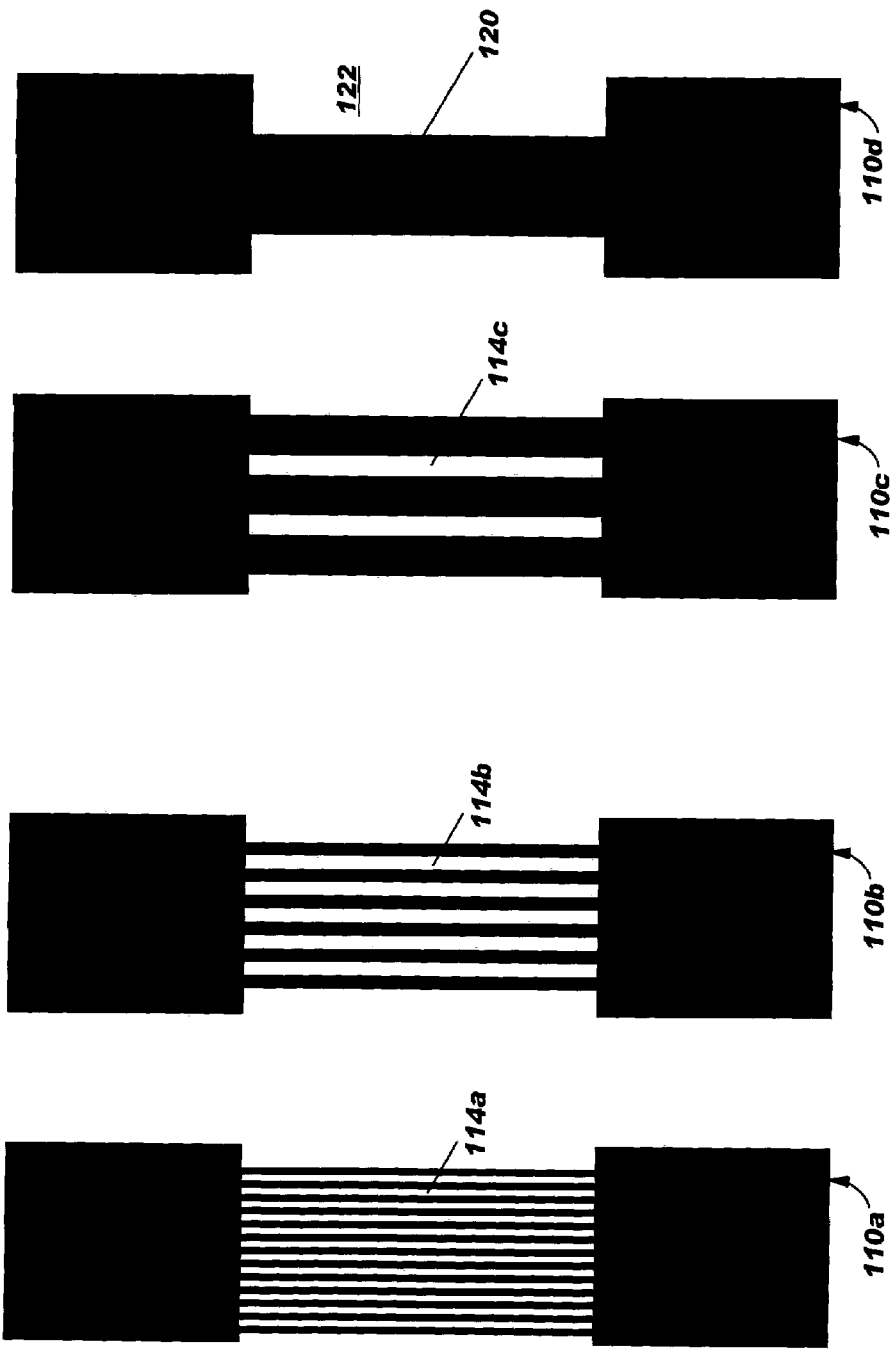
FIG. 4 shows a top-down representation of a number of embodiments of a template of FIG. 3.

FIG. 4 shows a top-down representation of a number of embodiments of template 110 of FIG. 3. As illustrated in FIG. 4, a template may vary in size, shape, existence or number of openings, and size of openings. Template 110*a* has a large number of very small openings 114*a*. Template 110*b* has fewer, larger openings 114*b*. Template 110*c* has still fewer, very large openings 114*c*. Finally, template 110*d* has no opening 114, but only a gap 122 adjacent to wall 120 of template 110*d*. The representations in FIG. 4 are for purposes of illustration only and are not meant to be limiting in any way. It should be understood by those skilled in the art that template 110 may be of any shape or size and may have any number of walls 120 or openings 114.

Figure 5:
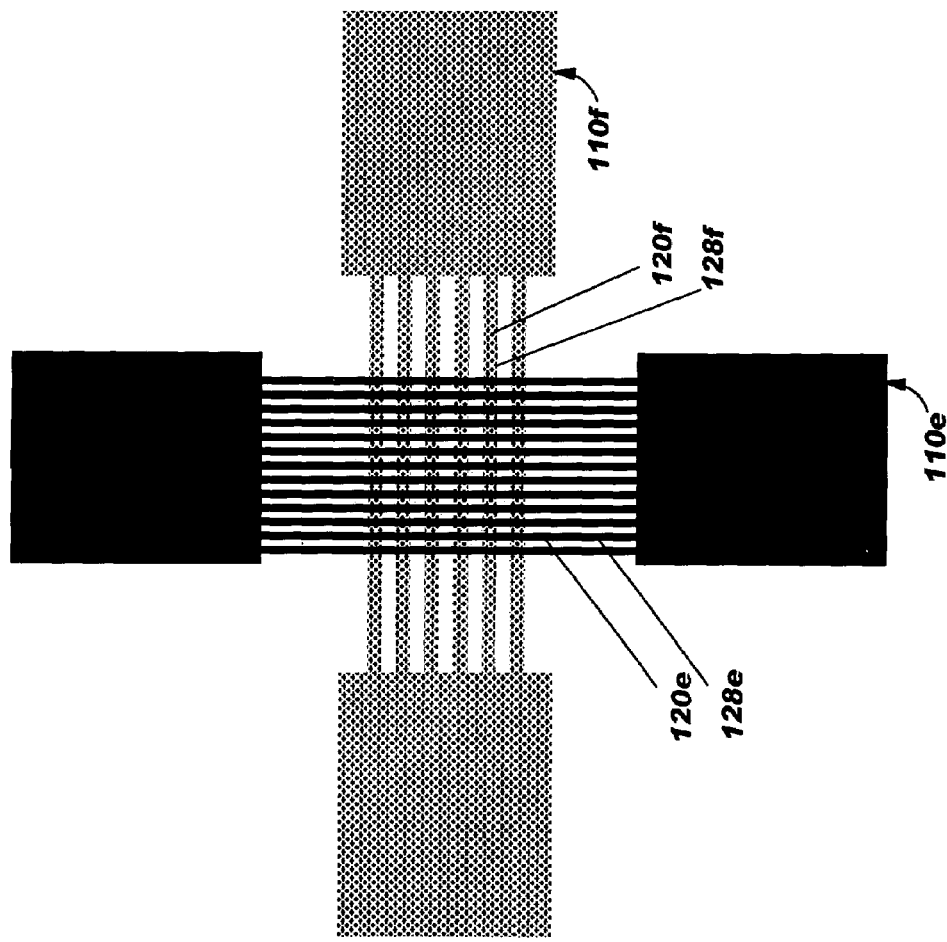
FIG. 5 shows a number of templates of FIG. 4 used in conjunction with one another.

FIG. 5 shows a top-down demonstration of how, in one embodiment, a number of templates 110 of FIG. 4 may be used in conjunction with one another to monitor the beam angle variance of ion beam 4 (FIGS. 2-3) in two dimensions. This may be accomplished by stacking a plurality templates 110*e*, 110*f* with an edge 128*e* of wall 120*e* of one template 110*e* arranged so as to be roughly perpendicular to edge 128*f* of wall 120*f* of the other template 110*f*. It should be recognized that edge 128*e* of wall 120*e* may also be at a non-perpendicular angle with edge 128*f* of wall 120*f* necessary to monitor the integrity of ion beam 4 (FIGS. 2-3). Integrity monitor system 100 may further refine the monitoring of ion beam 4 by using multiple templates 110*e*, 110*f* where the aspect ratio of opening width 116 (FIG. 3A, 3C) to wall depth 126 (FIG. 3A, 3C) of at least one template 110*e* differs from the aspect ratio of at least one other template 110*f*.

Figure 6:
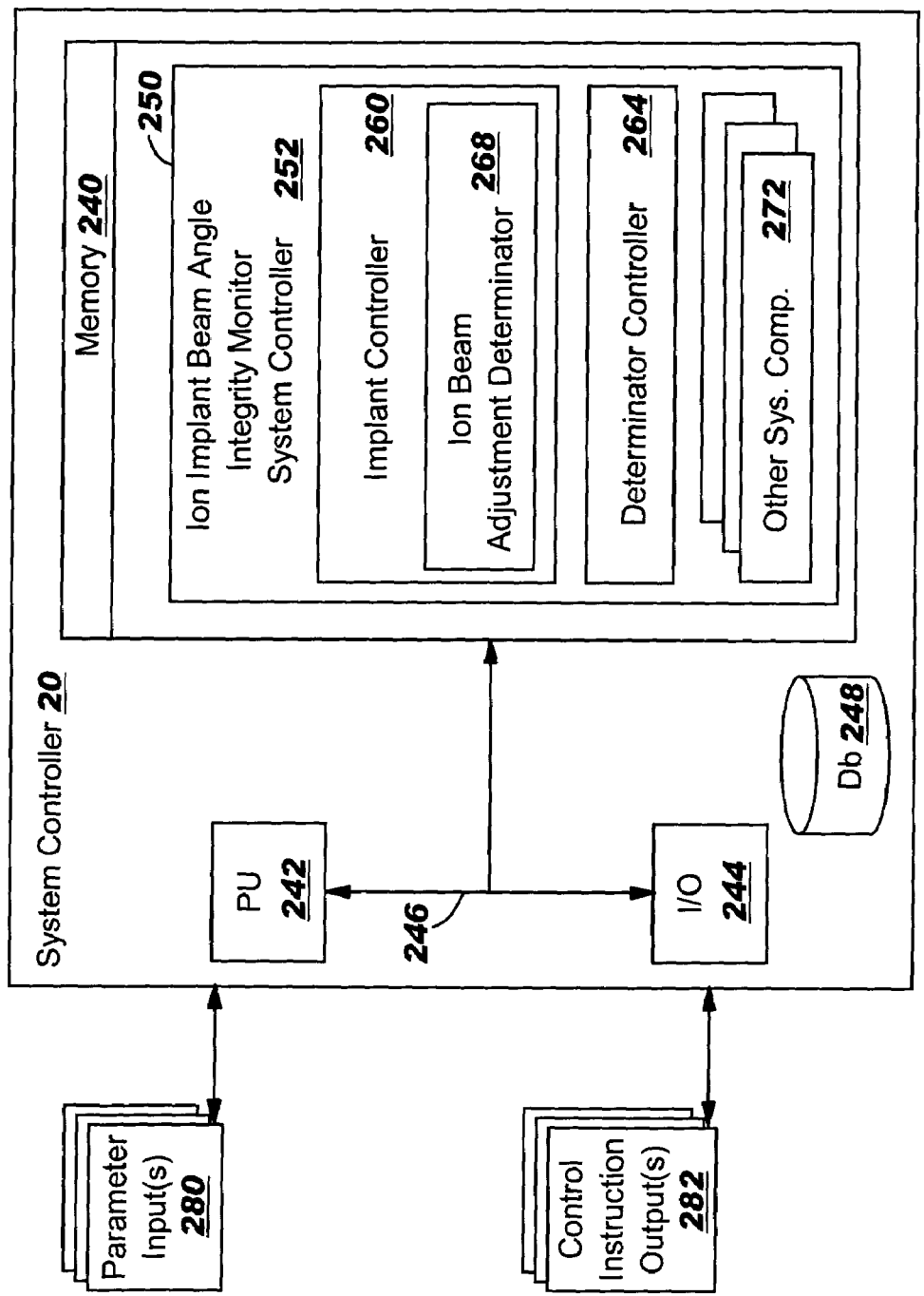
FIG. 6 shows a block diagram of a system controller of FIG. 2.

System Controller Overview:

Referring to FIG. 6, a block diagram of an illustrative system controller 20 is shown. System controller 20 includes a computer control system responsive to ion implanter system 10 (FIG. 2) and integrity monitor system 100 (FIG. 3A-3C) inputs. In one embodiment, system controller 20 includes a memory 240, a processing unit (PU) 242, input/output devices (I/O) 244 and a bus 246. A database 248 may also be provided for storage of data relative to processing tasks. Memory 240 includes a program product 250 that, when executed by PU 240, comprises various functional capabilities described in further detail below. Memory 240 (and database 248) may comprise any known type of data storage system and/or transmission media, including magnetic media, optical media, random access memory (RAM), read only memory (ROM), a data object, etc. Moreover, memory 240 (and database 248) may reside at a single physical location comprising one or more types of data storage, or be distributed across a plurality of physical systems. PU 242 may likewise comprise a single processing unit, or a plurality of processing units distributed across one or more locations. I/O 244 may comprise any known type of input/output device including a network system, modem, keyboard, mouse, scanner, voice recognition system, CRT, printer, disc drives, etc. Additional components, such as cache memory, communication systems, system software, etc., may also be incorporated into system controller 20.

As shown in FIG. 6, program product 250 may include an ion implant beam angle integrity monitor system controller 252 including an implant controller 260 having an ion beam adjustment determinator 268 (optional), a determinator controller 264, and other system components 272. Other system components 272 may include any now known or later developed parts of an ion implant beam angle integrity monitor system controller not individually delineated herein.

Referring to FIGS. 2 and 3A-3C, inputs to system controller 20 include a wide variety of ion implanter system 10, integrity monitor system 100, user entered or other parameter inputs 280. Parameter inputs 280 may indicate particular states of ion implanter system 10 or integrity monitor system 100 and/or particular components thereof or may indicate user defined input parameters. That is, a parameter input 280 may be any characteristic of ion implanter system 10 or integrity monitor system 100, user defined constants or other variables that may affect operation of the system including, in particular to the present invention, monitoring integrity of ion beam 4. Based on the above-described components of integrity monitor system 100 used to monitor ion beam 4 integrity, parameter inputs may include, for example, optimum trajectory 130, maximum variance angle 150, opening width 116, wall depth 126, rate of ion implantation, duration of ion implantation and determinator 160 input. Furthermore, based on the above-described components of ion implanter system 10, parameter inputs may include, for example, source magnet 42 voltage, source dopant gas 40 flow rate, source bias voltage 46, manipulator 52 positioning (e.g., X, Y, Z axis), suppression/extraction electrode 48, 50 current, acceleration suppression electrode 58 current, mass slit 60 spacing, pre and post-scan suppression electrode 62, 66 current, focus current, nitrogen ($N_2$) bleed 68 rate, corrector magnet 70 current, limiting aperture 72 control setting, profiler system 74 position, machine vacuum state, target vertical scan system position 18 control setting and/or horizontal ion beam scan speed. It should be recognized that the above-described list is meant to be illustrative only. For example, it is common for a conventional system controller to receive more than 5000 parameter inputs depending on the makeup of the ion implanter system used.

Ion Implant Beam Angle Integrity Monitor System Controller

Ion implant beam angle integrity monitor system controller 252 functions generally to monitor variance from optimum trajectory 130 of ions 140, 144a, 144b (FIG. 3A-3C) in ion beam 4 (FIG. 2-3C) during different stages of operation. Implant controller 260 controls generation and transmission of ion beam 4 containing ions 140, 144a, 144b (FIG. 3A-3C) by ion implanter system 10 (FIG. 2), i.e., via implant controller 260. Ion beam 4 is transmitted adjacent to at least one template 110 (FIG. 3A, 3C) having a surface 121 that impedes motion of ion 144a, 144b and that may change in response to the impacting by ion 144a, 144b that varies from optimum trajectory 130 (FIG. 3) by at least maximum variance angle 150 (FIG. 3A, 3C). As stated above, template 110 may be between ion beam generator 2 and target 106 (FIG. 3A) or, in an alternative embodiment, may be used in the absence of a target (FIG. 3C). Additionally, template 110 may include any material that undergoes a change in response to the impacting by ion 140, 144a, 144b, including, but not limited to, a photoresist, an oxide and a nitride hard mask material. As also indicated above, implant controller 260 may control transmission of ion beam 4 adjacent to one template 110 or multiple templates 110e, 110f (FIG. 5). Multiple templates 110e, 110f may be positioned with walls 120e, 120f (FIG. 5) aligned at any angle, including but not limited to perpendicular, with one another. Multiple templates 110e, 110f may also be such that the aspect ratio of at least one template 110e is different from the aspect ratio of at least one other template 110f.

Determinator controller 264 may control determinator 160 (FIGS. 2-3) to determine whether the trajectory of ion beam 4 varies from optimum trajectory 130 by at least maximum variance angle 150. Determinator controller 264 may control determinator 160 to make this determination by measuring the difference in change between first test target 106a (FIG. 3A) onto which ion beam 4 is directed along wall 120 of template 110 and second test target 106b (FIG. 3B) onto which ion beam 4 is directly directed to determine whether and/or the percentage of ions 140, 144a, 144b that impact first test target 106b (FIG. 3B) and not second test target 106a (FIG. 3A). Alternatively, determinator controller 264 may control determinator 160 (FIGS. 2-3C) to measure the change in the one or more templates 110 to determine whether and/or the percentage of ions 140, 144a, 144b that impact surface 121 of template 110 (FIGS. 3A, 3C), the ions 144a, 144b that impact template 110 being those that vary from optimum trajectory 130 by at least maximum variance angle 150. Determinator controller 264 may control determinator 160 of any type mentioned above or any system for measuring change of materials now known or later developed.

Ion beam adjustment determinator 268 may determine an adjustment of ion beam 4 based on input from determinator controller 264. The adjustment determined by ion beam adjustment determinator 268 may be provided to implant controller 260 to adjust the ion beam. Ion beam adjustment determiner 268 may determine and/or provide implant controller 260 with an adjustment for adjusting any aspect of ion implanter system 10 mentioned above or any other value necessary to adjust ion beam 4, including, but not limited to uniformity, parallelism to target, particle level and particle energy. Adjustments of ion implanter system 10, including the calibration of in situ ion angle diagnostics, can be made separately from ion implantation based on measurements made outside ion beam generator 4, itself, or may be made in real time based on the particle level, as detected by determinator 160, during beam tuning, uniformity tuning, angle diagnostics, and/or ion implantation.

It should be recognized that while a particular compartmentalization of functional components of ion implant beam angle integrity monitor system controller has been shown, it is envisioned that the arrangement may be altered within the scope of the invention.

Operation Methodology

Figure 7:
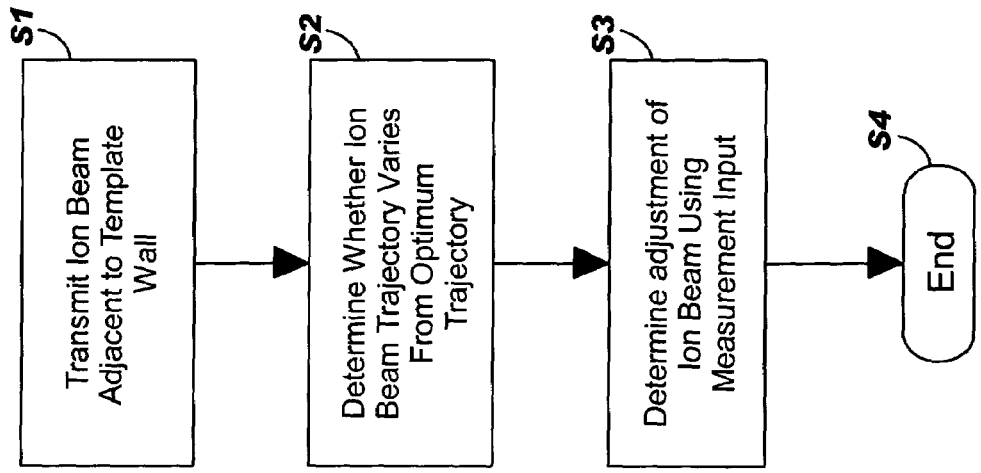
FIG. 7 shows a flow diagram of operation of an ion implant beam angle integrity monitor system of FIG. 6.

Referring to FIG. 7, a flow diagram of operation methodology for monitoring angle integrity of ion beam 4 (FIG. 2-3) generated by ion beam generator 2 (FIG. 2) and transmitted along wall 120 of template (FIG. 3A, 3C) will now be described. Referring to FIG. 7 in conjunction with FIG. 2, FIG. 3A-C and FIG. 6, in a first step S1, ion beam 4 is generated by ion beam generator 2 of ion implanter system 10 and transmitted adjacent to at least one template 110 (FIG. 3A, 3C) having surface 121 (FIG. 3A, 3C) that is made, at least in part, of a material that impedes the motion of ion 40, 44a, 44b (FIGS. 3A-C). Ion 244a, 244b (FIGS. 3A-C) in ion beam 4 having trajectory 148 (FIG. 3) that varies from optimum trajectory 130 (FIG. 3) by at least maximum variance angle 150 (FIG. 3) impacts surface 121 of template 110 (FIG. 3A and 3C). As described above, transmission step S1 may be accomplished using ion implanter system 10 (FIG. 2) as controlled by system controller 20 (FIGS. 2 and 6). As also noted above, step S1 may include using one template 110 or multiple templates 110e, 110f (FIG. 5) that may be positioned with wall 120 (FIG. 3A, 3C) aligned at any angle, including but not limited to perpendicular, with one other wall 120f; and may position multiple templates 110e, 110f with the aspect ratio of at least one template 110e being different from the aspect ratio of at least one other template 110f.

In step S2, a determination is made by determinator controller 264 to determine whether and/or the percentage of ions 140, 144a, 144b in ion beam 4 that vary from optimum trajectory 130 by at least variance angle 150 and thus monitor the integrity of ion beam 4. This determining step may be accomplished using determinator 160 as indicated above.

And, in optional step S3, ion implanter system 10 may be adjusted to adjust the angle integrity of ion beam 4 by implant controller 260 using an adjustment provided by ion beam adjustment determinator 268. In step S3, any aspect of ion implanter system 10 may be adjusted, including, but not limited to uniformity, parallelism to target, particle level and particle energy. As also noted above, the adjusting step may occur during at least one of a tuning stage of ion implanter system 10 or a uniformity procedure and a cleaning stage of ion implanter system 10. During ion implantation, in the case that the particle level exceeds a preset value, the adjusting step may include stopping ion implantation.

CONCLUSION

In the previous discussion, it will be understood that the method steps discussed are performed by a processor, such as PU 242 of system controller 20, executing instructions of program product 250 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. An ion implanter system, the system comprising:
an ion beam generator for generating an ion beam;
a platen;
a first test wafer disposed on the platen toward which the ion beam is directed;
a second test wafer disposed on the platen toward which the ion beam is directed along a wall of at least one template, the at least one template positioned adjacent an ion beam path, each template having a template surface that impedes a motion of an ion in the ion beam in response to the ion impacting the template surface, wherein the ion impacts the template surface in the case that a trajectory of the ion varies from an optimum trajectory by at least a pre-determined maximum variance angle and wherein the ion impacts the second test wafer in the case that the trajectory of the ion varies from the optimum trajectory by less than the pre-determined maximum variance angle; and
means for determining, using the at least one template and the first and second test wafers, whether an ion beam trajectory varies from the optimum trajectory by at least the pre-determined maximum variance angle to monitor an integrity of the ion beam, wherein the means for determining measures a difference between a first number of ions that impact the first test wafer and a second number of ions that impact the second test wafer to determine whether the ion beam trajectory varies from the optimum trajectory by at least the pre-determined maximum variance angle.

2. The system of claim 1, wherein the template surface undergoes a change in response to the impacting by the ion and wherein the means for determining measures the change in the template surface to determine whether the ion beam trajectory varies from the optimum trajectory by at least the pre-determined maximum variance angle.

3. The system of claim 1, wherein the at least one template includes an opening having a template opening width and a template wall having a template wall depth, and wherein an aspect ratio of the template opening width to the template wall depth corresponds to the pre-determined maximum variance angle.

4. The system of claim 3, wherein the at least one template includes a plurality of templates, wherein the aspect ratio of at least one template differs from the aspect ratio of at least one other template.

5. The system of claim 1, wherein the at least one template comprises at least two stacked templates oriented with an edge of the template wall of one template substantially perpendicular to the edge of the template wall of at least one other template.

6. The system of claim 1, wherein at least a portion of the template surface is at least one of a photoresist, an oxide and a nitride hard mask.

7. The system of claim 1, further comprising means for determining an adjustment of the ion beam based on an input from the means for determining.

8. A system for monitoring an integrity of an ion beam, the system comprising:
a platen;
a first test wafer disposed on the platen toward which an ion beam is directed;
a second test wafer disposed on the platen toward which the ion beam is directed along a wall of at least one template, the at least one template positioned adjacent an ion beam path, each template having a template surface that impedes a motion of an ion wherein the ion impacts the template wall in the case that a trajectory of the ion varies from an optimum trajectory by at least a pre-determined maximum variance angle and wherein the ion impacts the second test wafer in the case that the trajectory of the ion varies from the optimum trajectory by less than the pre-determined maximum variance angle; and
means for determining, using the at least one template and the first and second test wafers, whether an ion beam trajectory varies from the optimum trajectory by at least the pre-determined maximum variance angle to monitor the integrity of the ion beam, wherein the means for determining measures a difference between a first number of ions that impact the first test wafer and a second number of ions that impact the second test wafer to determine whether the ion beam trajectory varies from the optimum trajectory by at least the pre-determined maximum variance angle.

9. The system of claim 8, wherein the template surface undergoes a change in response to the impacting by the ion and wherein means for determining measures the change in the template surface to determine whether the ion beam trajectory varies from the optimum trajectory by at least the pre-determined maximum variance angle.

10. The system of claim 8, wherein the at least one template includes an opening having a template opening width and a template wall having a template wall depth, and wherein an aspect ratio of the template opening width to the template wall depth corresponds to the maximum variance angle.

11. The system of claim 10, wherein the at least one template includes a plurality of templates, wherein the aspect ratio of at least one template differs from the aspect ratio of at least one other template.

12. The system of claim 8, wherein the at least one template comprises at least two stacked templates oriented with an edge of a template wall of one template substantially perpendicular to the edge of the template wall of at least one other template.

13. The system of claim 8, wherein at least a portion of the template surface is at least one of a photoresist, an oxide and a nitride hard mask.

14. The system of claim 8, further comprising means for determining an adjustment of the ion beam based on an input from the means for determining.

15. A method of monitoring angle integrity of an ion beam, the method comprising the steps of:
  transmitting an ion beam toward a first test wafer disposed on a platen;
  transmitting the ion beam adjacent to at least one template toward a second test wafer disposed on the platen along a wall of the template, the at least one template having a template surface that impedes a motion of an ion that varies from an optimum trajectory by at least a pre-determined maximum variance angle and wherein the ion impacts the second test wafer in the case that the trajectory of the ion varies from the optimum trajectory by less than the pre-determined maximum variance angle; and
  determining, using the at least one template and the first and second test wafers, whether an ion beam trajectory varies from the optimum trajectory by at least the pre-determined maximum variance angle to monitor angle integrity of the ion beam, wherein the determining step measures a difference between a first number of ions that impact the first test wafer and a second number of ions that impact the second test wafer to determine whether the ion beam trajectory varies from the optimum trajectory by at least the pre-determined maximum variance angle.

16. The method of claim 15, wherein the template surface undergoes a change in response to the impacting by the ion and wherein the determining step measures the change in the template surface to determine whether the ion beam trajectory varies from the optimum trajectory by at least the pre-determined maximum variance angle.

17. The method of claim 15, wherein the at least one template includes an opening having a template opening width and a template wall having a template wall depth, and wherein an aspect ratio of the template opening width to the template wall depth corresponds to the maximum variance angle.

18. The method of claim 17, wherein the at least one template includes a plurality of templates, wherein the aspect ratio of at least one template differs from the aspect ratio of at least one other template.

19. The method of claim 15, wherein the at least one template comprises at least two stacked templates oriented with an edge of the template wall of one template substantially perpendicular to the edge of the template wall of at least one other template.

20. The method of claim 15, wherein at least a portion of the template surface is at least one of a photoresist, an oxide and a nitride hard mask.

21. The method of claim 15, further comprising, determining an adjustment of the angle integrity of the ion beam based on the determining step.

22. A computer program product comprising a computer useable medium having computer readable program code embodied therein for determining the integrity of the angle of an ion beam generated by a ion implanter system and transmitted by the ion implanter system, the program product comprising:
  program code configured to control transmitting an ion beam toward a first test wafer disposed on a platen;
  program code configured to control transmitting the ion beam adjacent to at least one template along a wall of the template toward a second test wafer disposed on the platen, the at least one template having a surface that impedes a motion of an ion that varies from an optimum trajectory by at least a pre-determined maximum variance angle and wherein the ion impacts the second test wafer in the case that the trajectory of the ion varies from the optimum trajectory by less than the pre-determined maximum variance angle; and
  program code configured to determine, using the at least one template and the first and second test wafers, whether an ion beam trajectory varies from the optimum trajectory by at least the pre-determined maximum variance angle to monitor angle integrity of the ion beam, wherein the program code measures a difference between a first number of ions that impact the first test wafer and a second number of ions that impact the second test wafer to determine whether the ion beam trajectory varies from the optimum trajectory by at least the pre-determined maximum variance angle.

23. The program product of claim 22, wherein the template surface undergoes a change in response to the impacting by the ion and wherein the program code configured to determine measures the change in the template surface to determine whether an ion beam trajectory varies from the optimum trajectory by at least the pre-determined maximum variance angle.

24. The program product of claim 22, further comprising program code configured to determine an adjustment of the ion beam based on an input from the program code configured to determine.

* * * * *